United States Patent [19]

Ventrudo et al.

[11] Patent Number: 5,715,263
[45] Date of Patent: Feb. 3, 1998

[54] FIBRE-GRATING-STABILIZED DIODE LASER

[75] Inventors: Brian F. Ventrudo; Grant Rogers, both of Victoria, Canada

[73] Assignee: SDL, Inc., San Jose, Calif.

[21] Appl. No.: 575,705

[22] Filed: Dec. 19, 1995

Related U.S. Application Data

[62] Division of Ser. No. 267,785, Jun. 28, 1994, Pat. No. 5,485,481.

[51] Int. Cl.$^6$ .................................................. H01S 3/10
[52] U.S. Cl. .................... 372/6; 372/29; 372/96; 372/108; 372/102; 385/10; 385/37
[58] Field of Search .................. 372/6, 22, 29, 372/96, 99, 108, 102, 32; 385/2, 10, 28, 31, 33, 37

[56] References Cited

U.S. PATENT DOCUMENTS

| | | | |
|---|---|---|---|
| 4,639,922 | 1/1987 | Miller | 372/19 |
| 4,786,132 | 11/1988 | Gordon | 385/37 |
| 4,963,832 | 10/1990 | Desurvire et al. | 330/4.3 |
| 5,185,752 | 2/1993 | Welch et al. | 372/22 |
| 5,309,260 | 5/1994 | Mizrahi et al. | 385/37 |
| 5,321,718 | 6/1994 | Waarts et al. | 372/99 |
| 5,430,817 | 7/1995 | Vengsarkar | 385/28 |
| 5,457,760 | 10/1995 | Mizrahi | 385/24 |
| 5,463,312 | 10/1995 | Lutz et al. | 385/2 |
| 5,471,490 | 11/1995 | Liedenbaum et al. | 372/32 |
| 5,488,475 | 1/1996 | Friebele et al. | 372/6 |
| 5,563,732 | 10/1996 | Erdogan et al. | 359/134 |

OTHER PUBLICATIONS

Jens Buus, "Single Frequency Semiconductor Lasers," SPIE Optical Engineering Press, Vol. TT5(10), pp. 81–90, 1991 (no month available).

B. F. Ventrudo et al., "Wavelength and Intensity Stabilization of 980 nm Diode Lasers Coupled to Fibre Bragg Gratings", Electronic Letters, vol. 30(25), pp. 2147–2148, Dec. 8, 1994.

C. R. Giles et al., "Simultaneous Wavelength—Stabilization of 980–nm Pump Lasers ", OSA & IEEE Conference on Optical Amplifiers and Their Applications, pp. PD11–1 to PD11–4, Jul. 4–6, 1993, Yokohama, Japan.

D. L. Williams et al., "Temperature Stable 1.3 μm Laser With Bragg Fibre Grating External Cavity for Access Networks", TU11, pp. 209–212 (1993) (no month available).

E. Brinkmeyer et al., "Fibre Bragg Reflector for Mode Selection and Line-Narrowing of Injection Lasers ", Electronics Letters, vol. 22(3), pp. 134–135, Jan. 30, 1986.

K. O. Hill et al., "Bragg Gratings Fabricated in Monomode Photosensitive Optical Fiber by UV Exposure Through a Phase Mask ", Applied Physics Letters, vol. 62(10), pp. 1035–1037, Mar. 8, 1993.

(List continued on next page.)

Primary Examiner—Rodney B. Bovernick
Assistant Examiner—Yisun Song
Attorney, Agent, or Firm—W. Douglas Carothers, Jr.

[57] ABSTRACT

A fibre Bragg grating is used to stabilize the intensity and frequency fluctuations of a diode laser. The diode laser is connected with an opto-mechanical apparatus to the fibre which contains the grating. The grating is formed in the guided-mode region of the optical fibre. The wavelength of maximum grating reflectivity is selected to lie near the maximum of the diode laser gain bandwidth. The magnitude and bandwidth of the grating reflectivity stabilizes the diode laser output without appreciably reducing the optical output power from the end of the fibre. The bandwidth of the optical spectrum of the diode laser is selected depending on the distance of the grating from the diode laser.

63 Claims, 2 Drawing Sheets

OTHER PUBLICATIONS

R. J. Horley et al., "System Measurements Using a Miniature Packaged Narrow Linewidth Fiber Grating Laser", *Optical Fiber Conference '92*, Poster Preview: System Technologies, p. 166, (1992) (no month available).

G. D. Maxwell et al., "Semiconductor External-Cavity Laser With a UV-Written Grating in a Planar Silica Waveguide", *Optical Fiber Conference '94*, pp. 151-152, (1994) (no month available).

G. Meltz et al., "Formation of Bragg Gratings in Optical Fibers by a Transverse Holographic Method", *Optics Letters*, vol. 14(15), pp. 823-825, Aug. 1, 1989.

P. A. Morton et al., "High-Power, Narrow-Linewidth, Stable Single-Mode Hybrid Laser", *Optical Fiber Conference '94*, pp. 102-103, (1994) (no month available).

C. A. Park et al., "Single-Mode Behaviour of a Multimode 1.55 μm Laser With a Fibre Grating External Cavity", *Electronics Letters*, vol. 22(21), pp. 1132-1133, Oct. 9, 1986.

R. W. Tkach et al., "Regimes of Feedback Effects in 1.5 μm Distributed Feedback Lasers", *Journal of Lighwave Technology*, vol. LT-4(11), pp. 1655-1661, Nov. 1986.

K. Y. Liou et al., "Narrow Linewidth Fibre External Cavity Injection Lasers", *Electronics Letters*, pp. 933-934, Sep. 26, 1985.

M. Ojima et al., "Diode Laser noise at Video Frequencies in Opical Videodisc Players", *Applied Optics*, pp. 1404-1410, May 1, 1986.

T. Ikegami et al., "Optical Fiber Amplifiers", SPIE Physical Concepts of Materials for Novel Optoelectronic Device Applications II: Device Physics and Applications, vol. 1362, pp. 350-360, Oct. 28, 1990-Nov. 2, 1990.

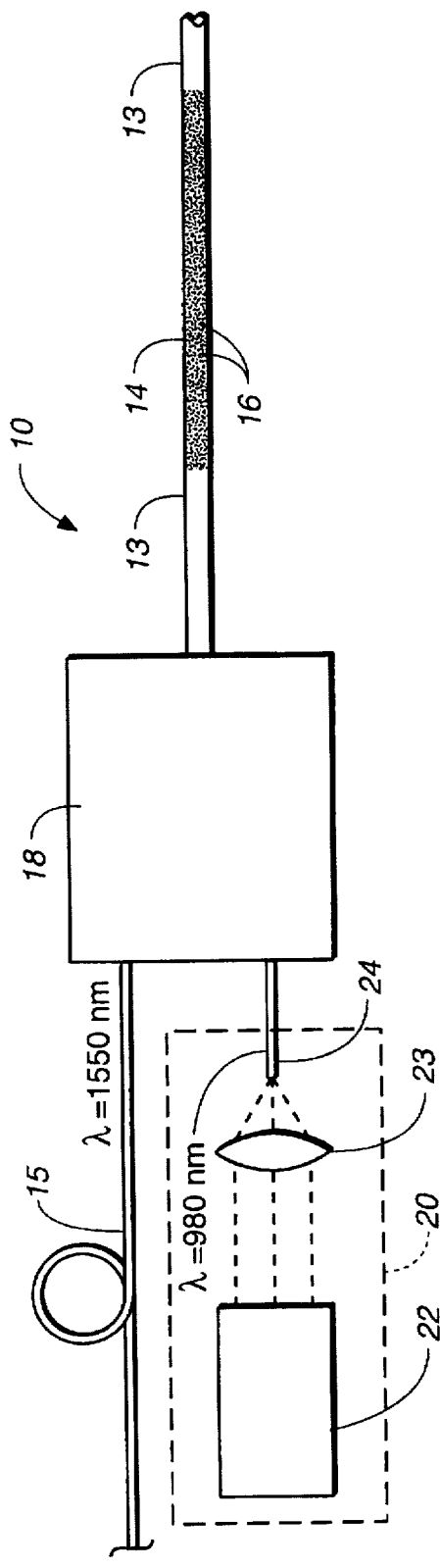
FIG._1 (PRIOR ART)
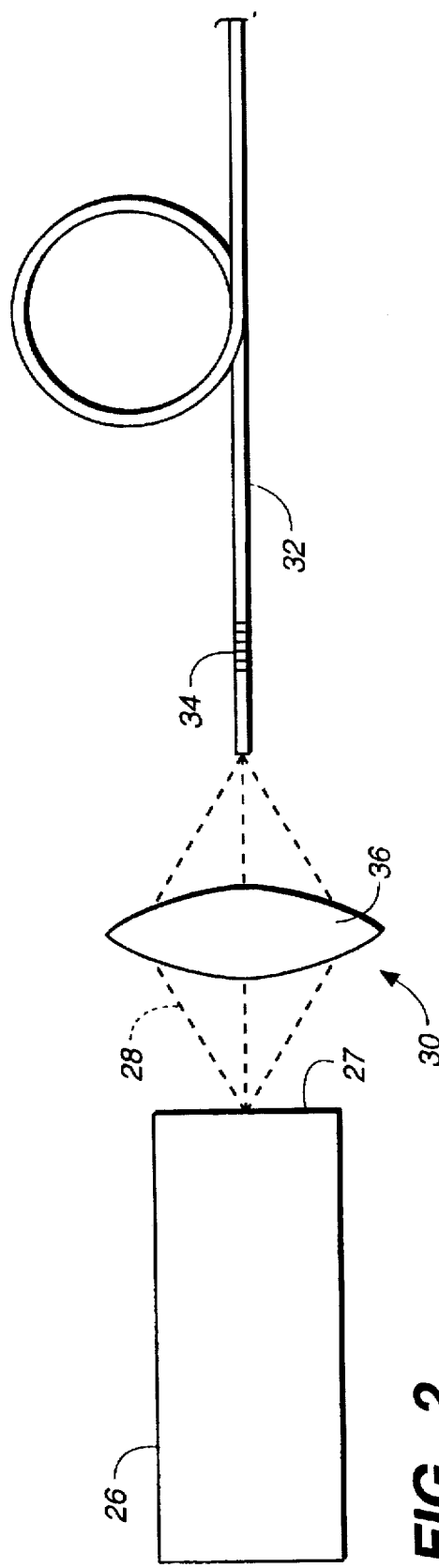
FIG._2

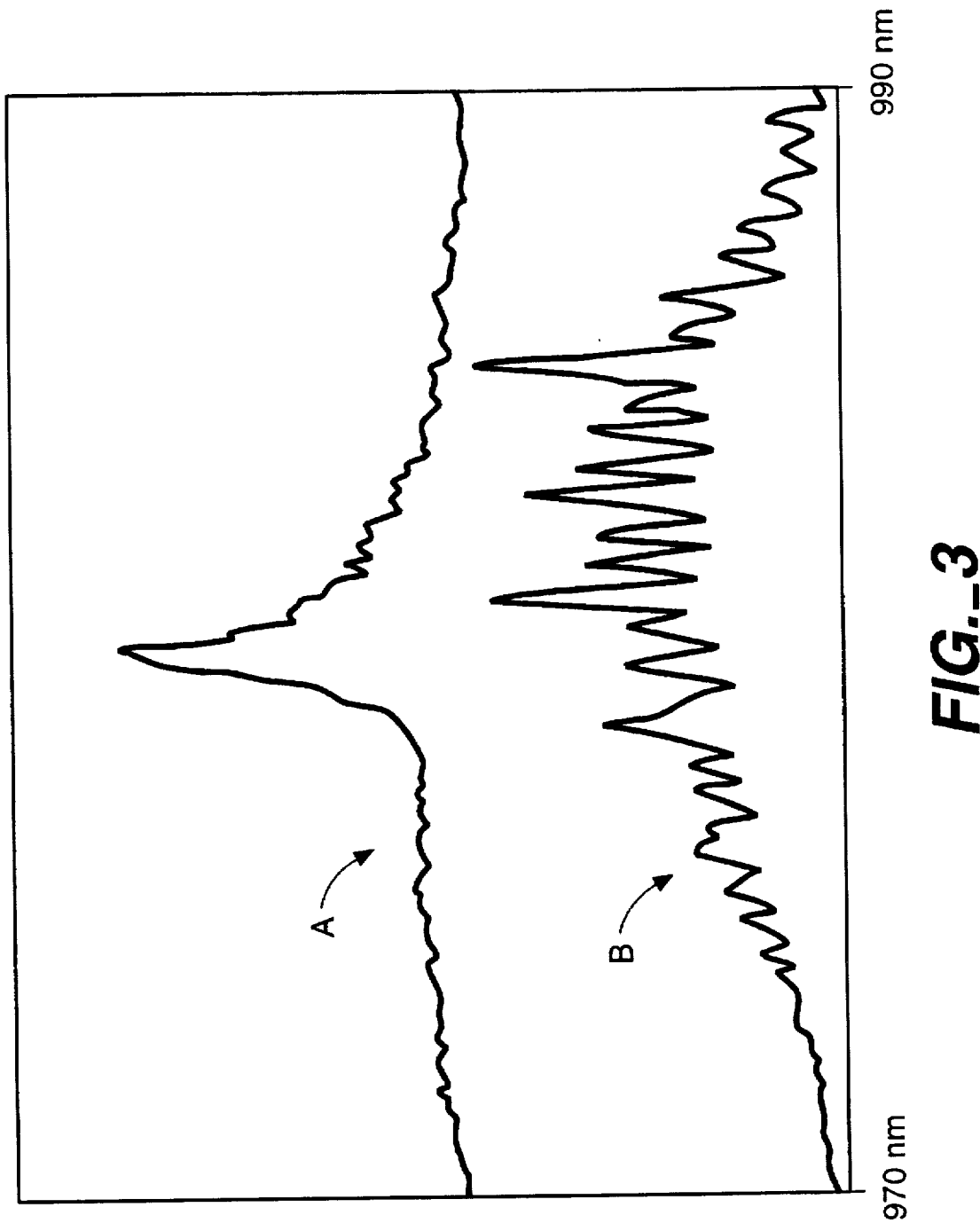
FIG._3

FIBRE-GRATING-STABILIZED DIODE LASER

This is a division, of application Ser. No. 08/267,785 filed on Jun. 28, 1994, now U.S. Pat. No. 5,485,481.

FIELD OF THE INVENTION

The present invention is a stabilized laser source which provides narrow-bandwidth high-power optical radiation with stable intensity and wavelength suitable, for example, for optically pumping solid-state fibre amplifiers or lasers such as fibre lasers.

BACKGROUND OF THE INVENTION

Optical fibre amplifiers and lasers have rapidly become important components of optical communications systems. Optical fibre amplifiers are used to intensify optical signals that are attenuated along the fibre-optic communication path. The have replaced cumbersome electrical repeaters in fibre-optic communication links allowing true all-fibre optical communications systems to be realized. Similarly, optical fibre lasers have been proposed to generate an optical carrier for fibre-optic communications systems. These lasers can be externally modulated or mode locked, and in some cases are an alternative to diode lasers as sources of high-power light in fibre optic communications systems.

Both fibre amplifiers and lasers operate on similar principles. The silica glass in the guided-wave portion of the optical fibre is doped with ions of rare-earth element such as, for example, erbium. The energy structure of the erbium ions is such that signal light with wavelengths of approximately 1530–1565 nm can be amplified in the fibre if the population of the excited states of the erbium ions is such that rate of stimulated emission exceeds that of spontaneous emission and absorption. In such a circumstance, light within the gain bandwidth entering the optical fibre will experience net gain, and will exit the fibre with greater power. If a mechanism is established to recirculate this amplified signal in the fibre, for example by placing the appropriate reflectors at the ends of the fibre, then laser action can occur in the fibre if the net gain equals the loss of the light within some optical bandwidth. In either case, it is crucial to excite the erbium ions into the proper excited state for gain to occur. This can be accomplished by exciting (pumping) the erbium ions with light near wavelengths of 980 nm, which is most conveniently provided by a high-power diode laser that is couple into the guided-wave portion of the optical fibre. The relatively small cross-sectional area of this portion helps to ensure high intensity and therefore allows appreciable gain of the signal wavelengths. However, those skilled in the art will appreciate that the properties of the signal produced by such an amplifier or laser will depend to a large extent on the properties of the diode laser used to pump the fibre itself.

In a practical system, the diode lasers are permanently and robustly connected with an opto-mechanical apparatus to a length of undoped optical fibre which in turn is connected to the doped fibre in the optical amplifier or laser. The assembly consisting of the diode laser, opto-mechanical apparatus and optical fibre is called a pigtailed diode laser. Presently, many pigtailed diode lasers have undesirable characteristics such as wavelength and intensity instabilities that create noise in the pumped system. The most troublesome sources of diode laser noise in the 980 nm diode lasers are mode-hopping noise and wavelength fluctuations that are caused by unwanted variable optical feedback into the diode laser or changes in temperature or injection current. The noise is especially detrimental in fibre amplifiers because it increases errors in the amplified optical communication signal and detracts from the practicality of these devices.

There are many techniques to reduce the effect of such diode laser noise. An example is an active electrical system that detects the variation in output of the fibre amplifier caused by a fluctuation in the diode laser characteristics and feeds back a signal into the laser diode at the correct phase to reduce the laser fluctuation. Unfortunately, this technique adds cost and complexity to the amplifier. It is preferable to employ a passive method of reducing diode laser fluctuations. An attractive solution is to feed back into the pump diode laser a portion of its own light. These lasers are very sensitive to optical feedback, and if such feedback is properly controlled, improved laser operation can result. Feedback is usually provided by an external reflector such as a mirror or diffraction grating, and external optical elements such as lenses are required to manipulate and guide the light out of an back into the diode laser cavity. Although the external optics and reflectors can often be quite compact, it is difficult and expensive to align such a system, and the mechanical and thermal stability can often be inadequate for use in fibre amplifiers and lasers. A more rugged technique for control of diode laser characteristics is required.

SUMMARY OF THE INVENTION

The present invention uses a fibre Bragg grating in a pigtailed diode laser to provide optical feedback into the cavity of a diode laser, thereby locking the frequency of the diode laser to that of the fibre grating, and reducing the longitudinal mode-hopping noise of the laser. A fibre Bragg grating is a periodic structure of refractive index variations in or near the guided-mode portion of the optical fibre that can reflect light of a certain wavelength propagating along the fibre. The reflected light propagates in the fibre in a direction opposite to that of the incident light. If a diode laser is pigtailed to a fibre containing a fibre Bragg grating, and if the centre of the grating bandwidth is within the gain bandwidth of the laser, then the optical spectrum of the diode laser will be affected. The exact effect depends on such parameters as the magnitude and bandwidth of the grating reflectivity, the centre wavelength of the grating relative to the laser, the magnitude of separation between the laser and grating, and the magnitude of injection current into the diode laser. In many cases, the laser characteristics can be improved a given application.

The apparatus according to the invention is formed by a diode laser, means for focusing the emission of the laser into a length of optical fibre, and a fibre grating formed in or near the guided wave portion of the optical fibre.

In one of its aspects, the invention consists of apparatus for generating a stable laser source having multiple longitudinal modes across a very narrow bandwidth. The apparatus comprises a diode laser that emits light in substantially a single spatial mode. An optical fibre is provided which is capable of guiding at least one mode of the diode laser in a portion of the fibre. Means are provided for directing the emitted light from the diode laser into the optical fibre. A fibre Bragg grating is formed in the region of the guided mode portion of the optical fibre.

DETAILED DESCRIPTION OF THE PREFERRED EMBODIMENT

The preferred embodiment of the invention will be described by reference to the drawings thereof wherein:

FIG. 1 is a schematic representation of a pigtailed diode laser associated with a fibre amplifier according to the prior art.

FIG. 2 is a schematic representation of a pigtailed diode laser according to the invention.

FIG. 3 is a graph comparing the output spectrum of a prior art pigtailed diode laser and of a pigtailed diode laser according to the invention.

FIG. 1 represents a fibre amplifier 10 including a pigtailed diode laser according to the prior art. Optical fibre 14 is doped with erbium (indicated by numerals 16) to provide amplifying effect and is coupled to undoped fibre 13. The amplifying effect may be achieved by exciting the erbium atoms with light at about 980 nm. This is achieved by coupling a 980 nm light source to the transmission light (at 1550 nm) from the transmission fibre 15 by means of an opto-electronic coupler 18.

The 980 nm light source is provided in the prior art by a pigtailed laser diode 20 consisting of a laser diode 22 coupled by lens 23 to undoped fibre 24. The limitations of prior art pigtailed laser diodes have been discussed above.

FIG. 2 is a schematic representation of a pigtailed diode laser according to the invention.

FIG. 3. is a graph comparing the output spectrum of a prior art pigtailed diode laser and of a pigtailed diode laser according to the invention.

FIG. 1 represents a fibre amplifier 10 including a pigtailed diode laser according to the prior art. Optical fibre 14 is doped with erbium (indicated by numerals 16) to provide amplifying effect and is coupled to undoped fibre 13. The amplifying effect may be achieved by exciting the erbium atoms with light at about 980 nm. This is achieved by coupling a 980 nm light source to the transmission light at 1550 nm) from the transmission fibre 15 by means of an opto-electronic coupler 18.

The 980 nm light source is provided in the prior art by a pigtailed laser diode 20 consisting of a laser diode 22 couple by lens 23 to undoped fibre 24. The limitations of prior art pigtailed laser diodes have been discussed above.

FIG. 2 illustrates a pigtailed laser diode according to the preferred embodiment of the invention. Diode laser 26 emits radiation in a single-spatial mode, and is typically fabricated with a quantum well epitaxial structure or index guided structure from InGaAs semiconductor material. The diode laser is most conveniently pumped by current injection. Diode lasers with the necessary characteristics are commercially available.

The diode laser 26 is configured to emit radiation primarily from the front facet 27. The divergent laser emission 28 is directed with focusing system 30 into the guided-mode portion of a length of optical fibre 32, containing an intra-core fibre Bragg grating 34. The focusing system of the preferred embodiment consists of a lensing system represented as numeral 36 to focus the laser diode output into the fibre 32. Alternatively, the fibre can be placed in such proximity to the diode laser that a substantial fraction of the emitted light is collected by the fibre.

The optical fibre 32 is typically fabricated from silica glass containing trace dopants to improve the light guiding characteristics of the fibre. The fibre grating 34 that provides optical feedback to the diode laser can be etched near the guided-mode portion of the fibre 34 using lithography techniques, or more commonly, can be created by exposing the fibre to a pattern of periodic intensity variation of high fluence ultraviolet light. If the latter technique is employed to fabricate the grating, it is convenient if the fibre core has a concentration of germanium to render the core sensitive to the ultraviolet light that forms the grating. The fibre 34 may be one that sustain a single or multiple spatial modes at the wavelength of emission of the diode laser.

The fibre grating 34 is selected to have maximum reflectivity within 10 nm of the diode laser emission wavelength, and the reflectivity is similar to that of the exit facet of the diode laser. The bandwidth of the grating reflectivity is typically 0.05 nm to 1 nm. The system can operate successfully when the grating 34 and the laser diode 26 are separated by a few hundred micrometers to several kilometers provided the amount of optical feedback into the laser remains greater than a certain magnitude. Using such configuration, the diode laser has substantially improved characteristics suitable for pumping solid-state amplifiers or lasers.

The light captured by the fibre 34 would normally propagate down a length of the fibre indefinitely, limited only by the fibre loss characteristics. The fibre Bragg grating 34 is fabricated within the guided mode portion or core of this length of fibre. The grating is fabricated such that the wavelength of its maximum reflection is within the gain bandwidth of the diode laser. This grating reflects a fraction of the diode laser emission light back through the fibre and the focusing system into the diode laser. The remainder of the light output passes through the fibre grating and down the remaining length of fibre.

The effect of the fibre grating on the characteristics of the diode laser optical output is explained by considering the wavelength-dependent loss in the coupled cavity formed by the fibre grating. Those skilled in the art will appreciate that the optical feedback from the fibre grating effectively reduces the loss from the laser cavity of light within the bandwidth of the fibre grating. It is well known that the laser can operate preferentially near the wavelength of lowest loss, hence the wavelength of the diode laser can be sifted from its free running value to the wavelength of the fibre grating. This can occur if the wavelength of the fibre grating is within the gain bandwidth of the diode laser, provided the magnitude of reflectivity from the grating is sufficient.

The behavior of the diode laser under conditions of optical feedback is complicated by the effect of the diode laser cavity itself, which if formed by the end facets of the semiconductor chip. In the preferred embodiment of the invention, the reflectivity of the grating as well as its wavelength are selected such that the broadband feedback from the diode laser cavity is greater than the feedback from the fibre grating. In this circumstance, the feedback from the fibre grating acts as perturbation of the coherent electric field formed in the diode laser cavity. This perturbation acts to break the coherence of the diode laser emission, thus broadening the bandwidth of the emission by several orders of magnitude, resulting in a spectral distribution as shown in curve A of FIG. 3. The fibre Bragg grating effectively locks the diode cavity output to the fixed wavelength of the grating and centres the external cavity multi-longitudinal modes around that wavelength. The presence of the multi-longitudinal modes reduces the magnitude of mode-hopping noise in the diode laser. This is termed coherence collapse of the diode laser. In addition, the centre wavelength of emission remains near the wavelength of maximum reflection from the fibre grating. The diode laser is thus constrained to operate within the grating bandwidth, so that large fluctuations in wavelength of the diode laser caused by changes in temperature or current are eliminated. Additionally, the laser is not perturbed by extraneous optical feedback from reflective components located beyond the fibre grating, provided the extraneous feedback is less than that provided by the fibre grating.

A diode laser in accordance with the present invention does not undergo transitions of single longitudinal laser cavity modes as are observed in free-running diode laser. Such transitions cause large intensity fluctuations in the diode laser output caused by competition between two modes during the transition. These mode transitions are caused by changes in laser injection current or temperature, for example, and are detrimental to the operation of an optical amplifier or fibre laser. The optical output of the invention consists of twenty or more longitudinal modes of the external cavity. Although the partitioning of optical power between the modes may change, there is much less fluctuation in laser intensity compared to that of a single mode, free-running diode laser.

The output power from the end of the fibre of the diode laser system is only slightly affected by the presence of the grating in the fibre. For weakly reflecting gratings, the output power from the fibre is reduced approximately by $(1-R_g)$ where $R_g$ is the maximum reflectivity of the grating. The injection current at laser threshold is slightly reduced by the presence of the grating. This effect increases the output power from the fibre and counteracts the aforementioned reduction of power.

The scope of the invention comprises a system in which the fibre grating is an arbitrary length from the diode laser. However, the magnitude of this length affects the operation of the diode laser. To ensure the maintenance of the coherence collapse of the laser emission, the fibre grating is located at a sufficient optical distance from the front facet of the diode laser. This distance must be much longer than the coherence length of the diode laser under the prescribed conditions of optical feedback, so that optical feedback from the fibre grating remains incoherent, thus assuring the laser remains in a state of coherence collapse. If the grating is placed within a few centimeters or less of the diode laser, then the feedback from the fibre grating may be coherent with the electric field inside the laser cavity, and very narrow linewidth operation of the diode laser will result. Such emission is very useful for some applications but is much less stable for the application of pumping fibre amplifiers or lasers because of the onset of laser cavity-mode transition noise when the laser operating characteristics change. In addition, there are still transitions from coherent to incoherent operation of the diode laser which cause intensity fluctuations which are detrimental to the operation of optical fibre amplifiers and lasers.

The present invention employs low-birefringent optical fibre that cannot maintain the polarization of the electromagnetic field in the guided region if the fibre is stressed. Accordingly, if the fibre experiences stress from bending, for example, the polarization of the light that propagates down the fibre and which is reflected back into the diode laser is of a different state of polarization than that which is emitted from the laser. The diode laser does not respond as effectively to optical feedback of different polarization, and the characteristics of the diode laser system may not be optimum. However, for cavity length of a few meters or less and bend radii of greater than 10 cm, it is typically found that the characteristics of the laser system remain sufficient to exhibit the improvements that have been so far described. Accordingly, the invention requires no provision for polarization control of the optical feedback.

In the preferred embodiment of the invention, a strained-layer InGaAs multi-quantum well diode laser is coupled to the optical fibre with an aspheric lens systems with efficiency of 60%. The efficiency of 60%. The laser emits light at 965–1025 nm, typically. The fibre grating has a reflection bandwidth of 0.2–0.3 nm and a peak reflectivity of approximately 3%. Accordingly, the effective reflectivity $R_{ef}$ seen by the fibre grating is in general $$R_{ef} = \eta 2 R_g$$

where $\eta$ is the coupling efficiency of the light from the solitary diode laser into the optical fibre, and $R_g$ is the maximum reflectivity of the fibre grating. For the specific values, for example, $(0.6)^2(3\%)=1.08\%$. This compares to the front facet of the diode laser, which has a nominal reflectivity of 4%. This level of optical feedback is sufficient to maintain the coherence collapse of the diode laser while allowing sufficient light to pass through the fibre grating, thus maximizing the available power. The wavelength of the grating reflectivity nominally lies within 10 nm of the wavelength of the diode laser. The grating is 1–2 mm in wavelength of the diode laser. The grating is 1–2 mm in length. To ensure the maintenance of the coherence collapse of the laser emission, the fibre grating is located at least 50 cm from the front facet of the diode laser. If it is desirable to maintain the coherence of the laser system, the fibre grating should be located as close as possible to the exit facet of the diode laser, and certainly not more than a few centimeters away.

The output power from the optical fibre in the preferred embodiment is at most reduced by a few percent. For a 150 Mw diode laser pigtailed with a fibre containing a fibre grating with peak reflectivity of 3%, the output power from the fibre may exceed 90 Mw which is similar to that from a fibre with no grating, within experimental uncertainty.

FIG. 3 illustrates the optical output spectrum of the present invention. As can be seen, curve B is the output spectrum of a 980 nm InGaAs pigtailed diode laser without a fibre grating. There is approximately 0.5% feedback into the diode laser from a broadband external reflector, which causes destabilization of the laser wavelength. In curve A, the diode laser operates under the same conditions, but there is a fibre grating with a peak reflectivity of 3% and a bandwidth of 0.3 nm. The improvement of the output spectrum is clear. The output of the invention is stable even when the injection current or temperature of the laser diode are significantly altered. Accordingly, no control of the laser diode temperature is required in some instances, which eliminates the need of a laser cooler and the associated control electronics. The power requirement to control the laser temperature is also suitably reduced.

It should now be evident that the present invention provides a highly stabilized source of high-power optical radiation that will improve the characteristics and stability of optical amplifiers and lasers that must be pumped with such a source.

Although the preferred embodiment has been described in relation to its use with a fibre amplifier in the reference to FIG. 1, it will be appreciated by those skilled in the art that it could also be used in association with a fibre laser.

What is claimed is:

1. An optical feedback system comprising:

a gain medium having a first optical cavity and having an output;

at least a first reflecting component in said first optical cavity and having an output facet providing a first reflectivity level for reflecting a portion of propagating light in said first optical cavity back into said cavity, said facet also providing a light output;

an optical fibre optically coupled to said first cavity to receive said light output;

a reflective element accompanying said optical fibre, said reflective element having a supplemental reflectivity level for reflecting a portion of said output over a narrow band of wavelengths back into said first cavity;

said supplemental reflectivity level approximately equal to or less than said first reflectivity level;

said fibre reflective element positioned in said optical fibre an optical distance from said first optical cavity sufficient to induce multiple longitudinal mode operation of said gain medium to suppress longitudinal mode hoping.

2. The optical feedback system of claim 1 wherein said gain medium is a semiconductor laser having a gain band at least a portion of which overlaps with said reflectivity band.

3. The optical feedback system of claim 2 wherein said fibre is a single mode fibre.

4. An optical feedback system comprising:

a gain medium having a first optical cavity and having an output;

at least a first reflecting component in said first optical cavity and having a first reflectivity level;

an optical fibre optically coupled to said first cavity;

a reflective element accompanying said optical fibre, said reflective element having a supplemental reflectivity level for reflecting a portion of said output over a narrow band of wavelengths back into said first cavity;

said supplemental reflectivity level approximately equal to or less than said first reflectivity level;

said fibre grating positioned in said optical fibre an optical distance from said first optical cavity sufficient to induce multiple longitudinal mode operation of said gain medium;

said gain medium is a semiconductor laser having a gain band at least a portion of which overlaps with said reflectivity band;

said supplemental reflectivity level sufficient to induce coherence collapse in said laser.

5. The optical feedback system of claim 2 wherein said reflective element is positioned beyond the coherence length of said laser.

6. The optical feedback system of claim 2 wherein said overlap of the gain band and reflectivity band stabilizes the operational wavelength of said laser over a range of operating conditions.

7. The optical feedback system of claim 6 wherein at least one of said operating conditions is a change in ambient temperature.

8. The optical feedback system of claim 2 wherein said semiconductor laser has an InGaAs strained layer quantum well gain medium.

9. The optical feedback system of 8 wherein said reflective element has a reflectivity peak which is within 10 nm of the peak gain of said gain medium.

10. The optical feedback system of claim 8 wherein said reflective element is positioned beyond the coherence length of said laser.

11. The apparatus of claim 4 wherein said supplemental reflectivity level is less than said first reflectivity level but of sufficient magnitude to maintain said coherence collapse and greater than any extraneous feedback present in said fibre.

12. An optical feedback system comprising:

a gain medium having a first optical cavity and having an output;

at least a first reflecting component in said first optical cavity and having a first reflectivity level;

an optical fibre optically coupled to said first cavity;

a reflective element accompanying said optical fibre, said reflective element having a supplemental reflectivity level for reflecting a portion of said output over a narrow band of wavelengths back into said first cavity;

said supplemental reflectivity level approximately equal to or less than said first reflectivity level;

said fibre grating positioned in said optical fibre an optical distance from said first optical cavity sufficient to induce multiple longitudinal mode operation of said gain medium;

said gain medium is a semiconductor laser having a gain band at least a portion of which overlaps with said reflectivity band;

said supplemental reflectivity level about 2 to 3 times less than said first reflectivity level.

13. The optical feedback system of claims 1 wherein said reflective element has a reflectivity peak which is within 10 nm of the peak gain of said gain medium.

14. The optical feedback system of claim 1 wherein said reflective element has a reflection bandwidth between about 0.05 nm and 2 nm.

15. The optical feedback system of claim 1 wherein said reflective element is a Bragg grating formed in said optical fibre.

16. Apparatus for generating a stable laser source comprising:

a laser source having a lasing cavity and a light beam output at a laser facet, said laser facet also providing a level of partial reflectivity for a portion of said light beam in said laser cavity for optical feedback therein, said light beam output comprising a wavelength band of light dependent upon the instantaneous operating characteristics of said laser source;

an optical fibre having an input end coupled to said laser source to receive said light beam into said fibre;

a grating formed in said optical fibre, said grating having a reflectivity band for partially reflecting selected wavelengths defined by said reflectivity band back into said laser cavity;

the reflectivity level of said optical fiber grating being approximately equal to or less than the reflectivity level of said laser source facet;

said fibre grating is sufficiently spaced from said laser source to induce multiple longitudinal mode operation of said laser source for enhancing optical spectrum stability and intensity.

17. The apparatus of claim 16 wherein said laser source contains a strained layer InGaAs quantum well.

18. The apparatus of claim 16 wherein said fibre input end coupling comprises a lens.

19. The apparatus of claim 16 wherein said fibre input end coupling comprises close position of said input end relative to said laser source facet.

20. The apparatus of claim 16 wherein said grating has a maximum reflectivity within 10 nm of the emission wavelength of said laser source absent said grating.

21. The apparatus of claim 16 wherein the reflection bandwidth of said grating is between about 0.05 nm and 2 nm.

22. The apparatus of claim 16 wherein the wavelength of maximum reflectivity of said grating wavelength band is within the gain bandwidth of said laser source.

23. The apparatus of claim 16 wherein the effective reflectivity, $R_{eff}$ of said grating is $$R_{eff} = \eta^2 R_g$$

where η is the coupling efficiency of said light beam output into said fibre, and $R_g$ is the peak reflectivity of said grating; the effective reflectivity of said grating is equal to or more than three times lower than the effective reflectivity level of said laser source facet.

24. The apparatus of claim 16 wherein the spacing of said grating from said fibre input end is greater than the coherence length of said light beam output.

25. Apparatus for generating a stable laser source comprising:
- a laser source comprising a semiconductor laser having an output facet for reflecting a portion of propagating light in the laser cavity back into said cavity, said facet also providing a light output;
- a bias current means for excitation of said laser to operate over a bias current range within a given temperature range;
- an optical fiber optically coupled to receive said laser light output;
- a grating in said optical fiber providing partial reflection over a narrow band of wavelengths, said wavelengths at least partially overlapping the wavelength emission band of said laser, said reflection providing optical feedback to said laser;
- the bias current and temperature range of said laser and the reflectivity band of said grating selected so that said laser source operates in multiple longitudinal modes such that the longitudinal mode hopping noise of said laser source is reduced providing enhanced optical spectrum stability.

26. Apparatus for generating a stable laser source comprising:
- a laser source comprising a semiconductor laser having an output facet for providing a light output;
- a bias current means for excitation of said laser to operate over a bias current range within a given temperature range;
- an optical fiber optically coupled to receive said laser light output;
- a grating in said optical fiber providing partial reflection over a narrow band of wavelengths, said wavelengths at least partially overlapping the wavelength emission band of said laser, said reflection providing optical feedback to said laser;
- the bias current and temperature range of said laser and the reflectivity band of said grating selected so that said laser source operates in multiple longitudinal modes such that the longitudinal mode hopping noise of said laser source is reduced;
- the reflectivity of said grating is less than or equal to the reflectivity of said laser output facet.

27. The apparatus of claim 25 wherein a reflection peak of said grating wavelength band is within 10 nm of an emission peak of said laser wavelength emission band absent said grating.

28. The apparatus of claim 25 said grating has a reflection bandwidth that is approximately equal to or less than 2 nm.

29. The apparatus of claim 25 wherein a spatial distance between said grating and said laser source output facet is longer than the coherence collapse distance of said laser.

30. The apparatus of claim 29 wherein said spatial distance is between about 50 centimeters and several meters.

31. The apparatus of claim 29 wherein said optical fiber has low birefringence so that it is polarization insensitive.

32. The apparatus of claim 31 wherein said optical fiber is polarization insensitive when stressed.

33. The apparatus of claim 25 wherein said optical fiber has a core doped with germanium, said grating is made by exposure of said fibre to UV light.

34. The apparatus of claim 25 wherein said optical fibre is coupled to another fibre via an optical coupler, said another fibre characterized by having an absorption band and capable of gain, said gain being produced by absorption of said output by said another fibre, the reflectivity peak and effective reflectivity of said grating selected to cause said laser to maintain a stable wavelength emission band of said output within the absorption band of said another fibre.

35. The apparatus of claim 25 wherein said grating stabilizes said laser wavelength emission band sufficiently to eliminate the need for active temperature control over the operating temperature range of said laser.

36. The apparatus of claim 25 wherein said laser operates with varying temperature and said grating provides optical feedback to stabilize the operation of said laser within a desired narrow range of wavelengths despite said temperature variation so that, in absence of said grating reflection, said operating wavelength would shift outside of said desired narrow range of wavelengths.

37. Apparatus for generating a stable laser source comprising:
- a laser source having an output facet providing optical feedback and for providing an output, said output optically coupled to an optical fibre;
- a grating in said fibre providing a narrow wavelength band including wavelengths that are at least partially overlapping said wavelength emission spectrum of said laser source, absent said grating, and at least partially reflected to provide optical feedback to said laser source via said grating;
- separation between said grating and laser source and magnitude of optical feedback from said grating being selected such that said laser source is constrained to operate at the peak wavelength of said grating and within the multiple longitudinal modes of the grating bandwidth so that longitudinal mode hopping of said laser source is suppressed.

38. The apparatus of claim 37 wherein the effective reflectivity of said grating is less than or equal to the effective reflectivity of reflective means provided integral with said laser source.

39. The apparatus of claim 37 said grating has a reflection bandwidth that is approximately equal to or less than 2 nm.

40. The apparatus of claim 37 wherein a spatial distance between said fiber grating and said laser source output facet is less than several meters.

41. The apparatus of claim 40 wherein said spatial distance is between about 50 centimeters and several meters.

42. The apparatus of claim 37 wherein a spatial distance between said fiber grating and said laser source is longer than the distance causing coherence collapse.

43. The apparatus of claim 37 wherein said optical fiber has low birefringence so that it is polarization insensitive.

44. The apparatus of claim 43 wherein said optical fiber is polarization insensitive when stressed.

45. The apparatus of claim 37 wherein said grating controls said output to be at a wavelength within an absorption band of a solid state gain medium.

46. The apparatus of claim 45 wherein said solid state gain medium includes a fibre amplifier.

47. The apparatus of claim 45 wherein said solid state gain medium includes a fibre laser.

48. Apparatus for generating a stable laser source comprising:
- a laser source having a lasing cavity and a light beam output at a laser facet, said output optically coupled to an optical fibre;
- a grating in said fibre such that a narrow band of wavelengths are reflected which at least partially overlaps a wavelength emission band of said laser source absent said grating;
- a reflectivity level of said grating being approximately equal to or less than a reflectivity level of said laser source output facet with said fibre grating spaced from said laser source for enhancing optical spectrum stability and intensity.

49. The apparatus of claim 48 wherein a reflection peak of said grating wavelength band is within 10 nm of an emission peak of said laser wavelength emission band in the case where said grating is not present.

50. The apparatus of claim 48 wherein the effective reflectivity of said grating is less than or equal to the effective reflectivity of reflective means provided integral with said laser source.

51. The apparatus of claim 48 said grating has a reflection bandwidth that is approximately equal to or less than about 1 nm.

52. The apparatus of claim 48 wherein a spatial distance between said fiber grating and said laser source output facet is less than several meters.

53. The apparatus of claim 52 wherein said spatial distance is between about 50 centimeters and several meters.

54. The apparatus of claim 48 wherein said optical fiber has low birefringence so that it is polarization insensitive.

55. The apparatus of claim 54 wherein said optical fiber is polarization insensitive when stressed.

56. The apparatus of claim 48 wherein said grating controls said output to be at a wavelength within an absorption band of a solid state gain medium.

57. The apparatus of claim 56 wherein said solid state gain medium includes a fibre amplifier.

58. The apparatus of claim 56 wherein said solid state gain medium includes a fibre laser.

59. The apparatus of claim 37 wherein the peak reflectivity of said grating being within 10 nm of said wavelength emission band of said laser source.

60. The apparatus of claim 37 wherein a reflectivity level of said grating is greater than extraneous feedback to said laser source.

61. The apparatus of claim 48 wherein said grating is positioned in said fibre at or beyond the coherence length of said laser source.

62. The apparatus of claim 48 wherein a spatial distance between said grating and said laser source is sufficient to cause coherence collapse of said laser source.

63. The apparatus of claim 48 wherein said optical spectrum stability of said laser source is brought about, at least in part, by causing said laser source to operate in multiple longitudinal modes in a manner suppressing longitudinal mode hopping.

* * * * *

UNITED STATES PATENT AND TRADEMARK OFFICE
CERTIFICATE OF CORRECTION

PATENT NO. : 5,715,263

DATED : February 3, 1998

INVENTOR(S) : Brian F. Ventrudo and Grant Rogers

It is certified that error appears in the above-identified patent and that said Letters Patent is hereby corrected as shown below:

Column 6, lines 15 and 16, delete the sentence, "The grating is 1-2 mm in wavelength of the diode laser."

Column 7, line 30 and column 8 line 8, delete "grating" and inset -reflective element--

Column 7, line 58, delete "apparatus" and insert --optical feedback system--

Signed and Sealed this

Twenty-fourth Day of August, 1999

*Attest:*

Q. TODD DICKINSON

*Attesting Officer*  Acting Commissioner of Patents and Trademarks

UNITED STATES PATENT AND TRADEMARK OFFICE
CERTIFICATE OF CORRECTION

PATENT NO. : 5,715,263
DATED : February 3, 1998
INVENTOR(S) : Brian F. Ventrudo and Grant Rogers It is certified that error appears in the above-identified patent and that said Letters Patent is hereby corrected as shown below:

On the title page of the patent, "Division of Ser. No. 267,785, Jun. 28, 1994, Pat. No. 5,485,481" should be changed to --Continuation of Ser. No. 267,785, Jun. 28, 1994, Pat. No. 5,485,481--

Signed and Sealed this

Fifth Day of December, 2000

*Attest:*

Q. TODD DICKINSON

*Attesting Officer*     *Director of Patents and Trademarks*